United States Patent [19]

Seitz

[11] 4,429,347
[45] Jan. 31, 1984

[54] EASILY REMOVABLE SUPPORT ASSEMBLY FOR A HIGH VOLTAGE DC POWER SUPPLY

[75] Inventor: James P. Seitz, Burlington, N.J.

[73] Assignee: NWL Transformers, Bordentown, N.J.

[21] Appl. No.: 262,134

[22] Filed: May 11, 1981

[51] Int. Cl.³ ............................................. H05K 7/20
[52] U.S. Cl. .................................... 361/379; 361/385; 363/141
[58] Field of Search ...................... 307/149, 150, 156; 361/331, 334, 335, 346, 356, 358, 363, 379, 380–382, 385, 390, 391, 395, 399, 417, 419, 420, 332; 363/141, 144, 146; 174/15 R

[56] References Cited

U.S. PATENT DOCUMENTS

| | | | |
|---|---|---|---|
| 3,226,602 | 12/1965 | Elfving | 361/386 |
| 3,249,817 | 5/1966 | Sinclair | 361/385 |
| 3,564,386 | 8/1970 | Leonard | 361/385 |
| 3,571,771 | 3/1971 | Stephanson | 361/334 |
| 3,600,636 | 8/1971 | Peterson | 361/385 |
| 3,713,060 | 1/1973 | Harlow | 174/15 R |
| 3,792,338 | 2/1974 | Barthelemy | 361/385 |
| 3,858,090 | 12/1974 | Lehmann | 361/385 |
| 3,898,537 | 8/1975 | Mayse | 361/429 |
| 4,091,143 | 5/1978 | Blair, Jr. | 361/334 |
| 4,091,439 | 5/1978 | Blair, Jr. | 361/385 |

*Primary Examiner*—G. P. Tolin
*Attorney, Agent, or Firm*—Ratner & Prestia

[57] ABSTRACT

A high voltage DC power supply having a transformer and other electrical components housed within a tank containing fluid. A transformer is rigidly secured to the tank. There is further provided a compact, easily removable insulated support assembly for carrying at least a major portion of the other electrical components including rectifiers. The support assembly is removably secured and suspended by a support structure so that the support assembly extends within the tank independent and free of attachment to other portions of the power supply. A top of the tank is formed of a first cover and a second removably secured cover for covering an opening in the tank only substantially large enough to receive the transformer. The support assembly by itself may be quickly installed and by itself quickly removed.

13 Claims, 5 Drawing Figures

EASILY REMOVABLE SUPPORT ASSEMBLY FOR A HIGH VOLTAGE DC POWER SUPPLY

BACKGROUND OF THE INVENTION

A. Field of the Invention

This invention relates to high voltage DC power supplies and in particular to a compact easily removable support assembly for electrical components.

B. Background Art

Conventional power supplies have been limited in the manner in which the various electrical components have been supported within the unit. For example, conventional D.C. power supplies have left much to be desired in their requirement that the electronic components such as rectifiers, voltage and current sense networks, and switch assembly be mounted on a rig directly connected and not easily removable from the transformer itself. The entire transformer as well as its associated electronics as a complete unit was inserted into the tank. Specifically, the steps of construction have, in the past, required that the rig be fastened to the transformer and that the components be attached, either individually or as stacked assemblies, to the rig. Since the components were both physically and electronically attached to the transformer and because the components consisted of many individual pieces requiring numerous couplings and fasteners, expensive labor has been required to assemble the unit prior to placing it within the tank.

Also the electrical components were undesirably attached to the transformer on a piece by piece basis so that the unit could only be constructed at the transformer site, i.e. whereever the transformer was located. The rig and its electrical components could never be economically assembled elsewhere and brought to the transformer site for easy installation in the tank and quick attachment to the transformer. The disadvantage of this prior method of construction has been that the entire unit would have to be removed from the tank in order to repair a faulty electrical component; an expensive and time consuming task even for the most minor of electrical failures. This has entailed the use of expensive, heavy equipment lifts each time a unit had to be removed from its housing for repair.

The entire top of the tank had to be completely open in order to be able to receive, at the same time, the transformer and its attached electronic component rig. The unit had the drawback of being bulky and inefficiently structured thereby taking up an excessive amount of space and requiring the use of a large amount of coolant. Because of the large opening, more than one cover was undesirably required. One cover was designed primarily for a quick maintenance inspection. A second cover has been required in order to gain access to the interior of the tank for actual removal and replacement of the electrical components. However, it was typically too heavy for simple manual removal. Furthermore, the cover had to, first, be disconnected from the bus ducting and that, in itself, required numerous disassembly procedures.

Summary of the Invention

A high voltage DC power supply having a transformer and other electrical components housed within a tank where the transformer is rigidly secured to the tank. There is provided a compact, easily removable insulated support assembly for carrying at least a major portion of the other electrical components. The support assembly is removably secured and suspended by a support structure so that the support assembly extends within the tank independent and free of attachment to other portions of the power supply. In this manner, the support assembly by itself may be entirely installed and by itself may be entirely removed while at the same time leaving the transformer and fluid in place.

DESCRIPTION OF THE PREFERRED EMBODIMENT

Figure 1:
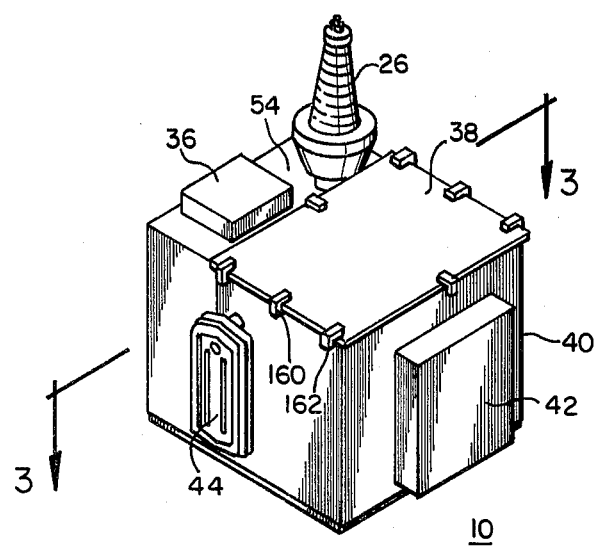
FIG. 1 is a perspective view of a high voltage DC power supply embodying the present invention.

Referring to FIGS. 1-5 there is shown a high voltage DC power supply 10 where high voltage is broadly defined in terms of thousands of volts. For example, supply 10 may be a transformer rectifier set (T/R) which together with its associated control system fulfills the electrical requirements for electrostatic precipitators. The control system (not shown) adjusts voltage and current to the point where current is no longer increasing such that the operating point of the precipitator has been reached. The T/R set provides the specified DC high voltage and current for the electrostatic precipitator and, for the most efficient precipitator operation, the kilowatt output of the T/R set should be maintained as close to the spark threshold as possible. Power Supply 10 comprises a tank housing 40, a transformer 48, and a support assembly 98, carrying an air core reactor 20, rectifiers 96 and a switch 18.

There is, at least, one cover for tank 40. Specifically, for this preferred embodiment, tank 40 has one manually removable gasketed cover portion 38, a high voltage bushing 26 which is normally at negative polarity, a cover for high voltage two position switch 36 for full wave rectification, a radiator 44 for purposes of cooling and a housing for a current limiting reactor 42. The fluid which surrounds all of the internal components of the tank is either oxidation resistant oil or a silicone fluid (dimethyl silicone).

The tank has an opening 106 where a cover portion 38 of the opening is manually removable and where the remaining cover portion 54, specifically that portion where the high voltage position switch cover 36 and high voltage bushing 26 are attached, is irremovably fixed and welded to the top of the tank. A plurality of U-shaped metal sleeves 160 are positioned, spaced apart from each other, and welded near the top of the side walls of the tank. A plurality of clamps 162 are bolted to U-shaped metal sleeves 160 in order to hold the removable cover portion 38 in place for the purpose of providing both a pressure/vacuum and weather seal.

Figure 3:
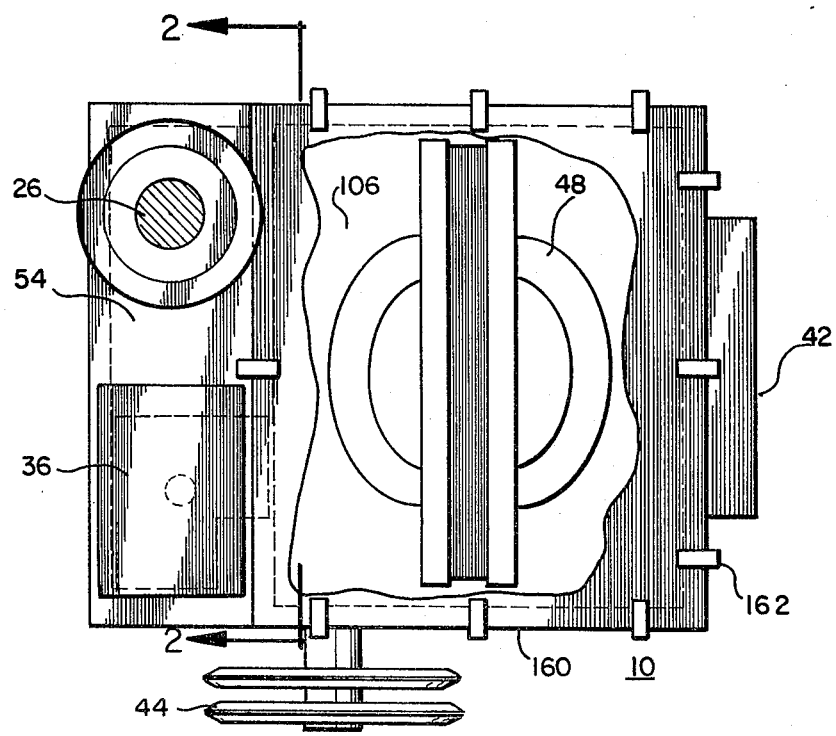
FIG. 3 is a top elevational view with a cut-away showing the transformer of FIG. 1.

Bolted to the floor at the bottom of the tank, FIG. 3, is a main-transformer 48 which is positioned directly underneath removable cover 38 of tank 40.

Figure 2:
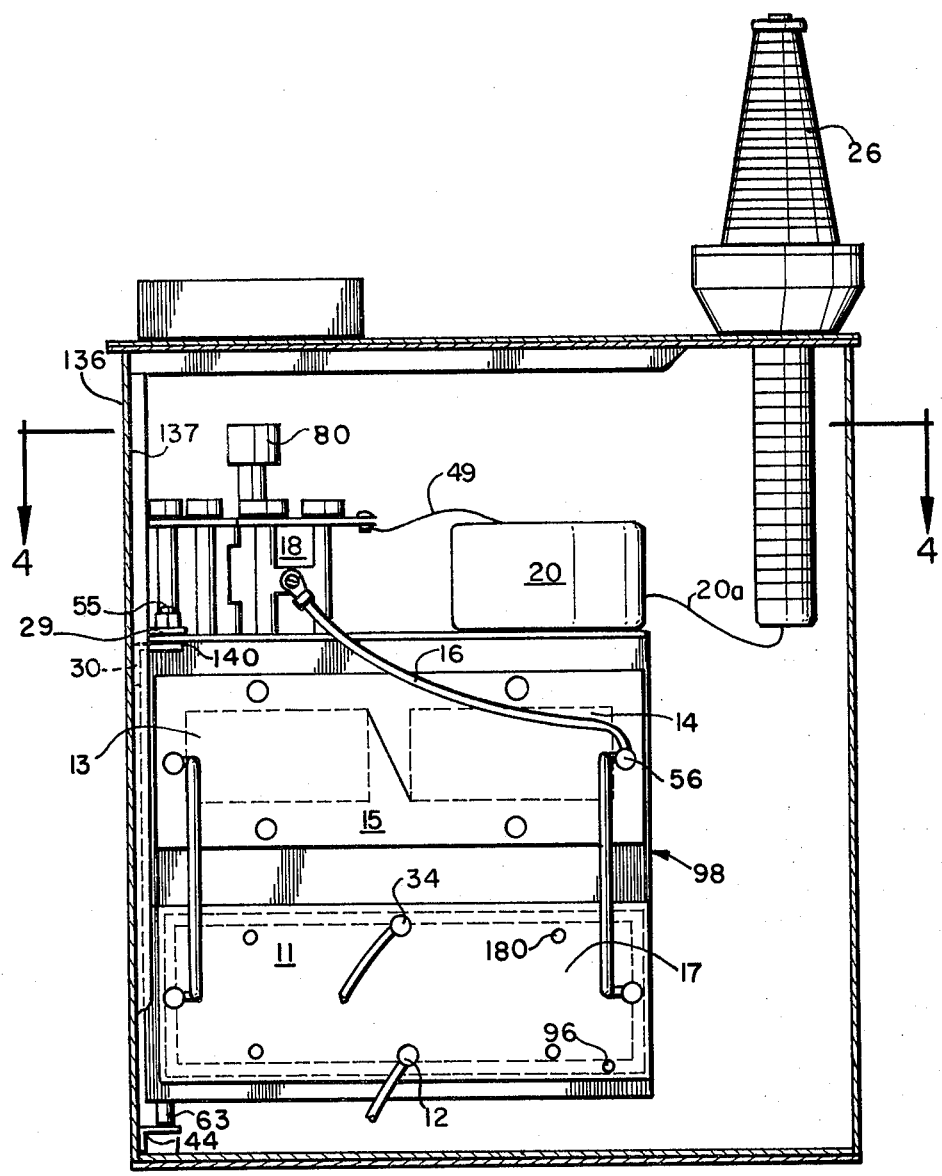
FIG. 2 is a cross-sectional view taken along lines 2—2 showing the support assembly within the power supply of FIG. 1.
Figure 4:
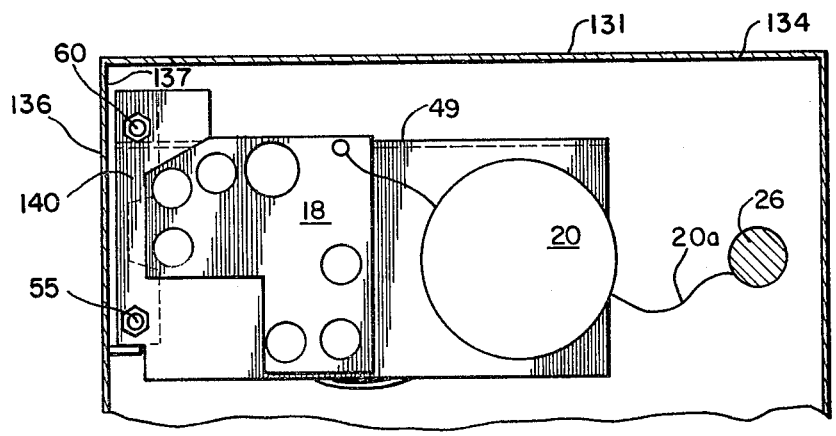
FIG. 4 is a top sectional view taken along lines 4—4 of FIG. 2.
Figure 5:
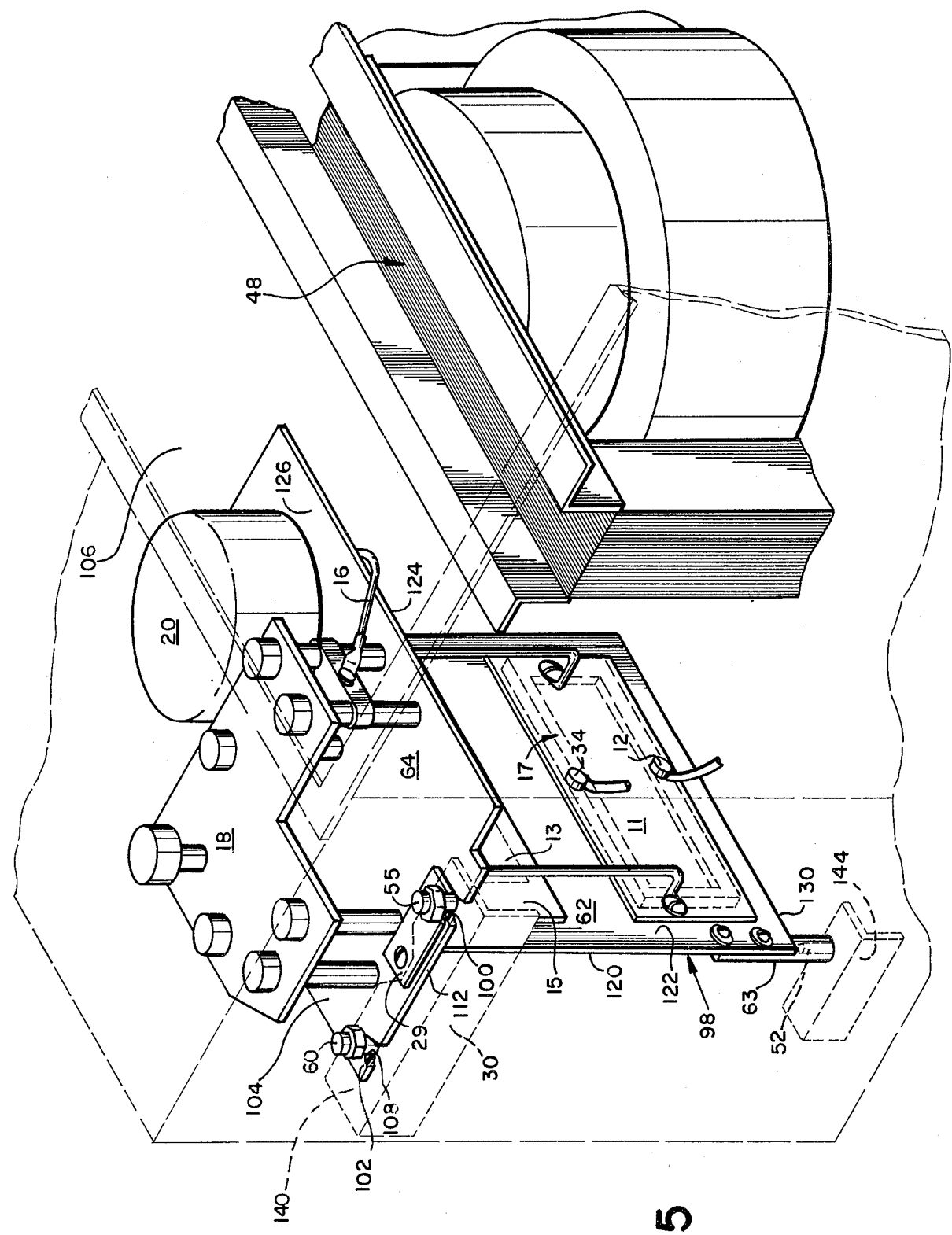
FIG. 5 is a diagrammatic perspective view in cut-away of the transformer and support assembly of FIG. 1.

As best shown in FIGS. 2 and 5, the support assembly 98 comprises a component support having a horizontal base plate section 64 which is representative of the horizontal line of the character "L" and a vertical plate section 62 which is representative of the vertical line of the character "L". Base plate 64 is generally rectangular in shape while vertical plate 62 has a substantially square shape where the length of base plate 64 is approximately equal to the length of each side of vertical plate 62. The longitudinal dimension of vertical plate 62 is perpendicular to base plate 64 and the transverse dimension of vertical plate 62 is parallel to a lengthwise edge of base plate 64. An end portion 102 of base plate 64 extends slightly beyond an edge of vertical plate 62 thereby elongating the width of edge 112 of base plate 64 and forming a rectangular tab 104. A portion of vertical plate 62 just below the elongated edge 112 of base plate 64 has been removed and the notch that remains extends transversely and towards the point at which a side of tab 104, parallel to elongated edge 112, meets, perpendicularly, the lengthwise edge of base plate 64.

Tab 104 extends slightly beyond the outermost surface 120 of vertical plate 62 and base plate 64 extends beyond the innermost surface 122 of vertical plate 62. Vertical plate 62 is perpendicular to the bottom surface 124 of base plate 64 and the side opposite and parallel to bottom surface 124 of base plate 64 is the top surface 126.

End portion 102, with tab 104 extending therefrom, has two holes or openings: a first hole 108 within tab 104 and the second hole 100 within the end region opposite the first hole 108 and along elongated edge 112 of base plate 64.

Below first hole 108 in tab 104 region of base plate 64, permanently welded within close proximity to the right angle corner 130 of outermost surface 120 of vertical plate 62, is a metal sleeve 63. The metal sleeve is mounted parallel to the vertical edge of vertical plate 62.

Horizontal base plate 64 has, removably secured to it along its top surface 126, a high voltage switch assembly 18 positioned within close proximity to elongated edge 112 of base plate 64, first hole 108 and second hole 100. The air core reactor 20 is removably mounted on top surface 126 and distal to elongated edge 112 of base plate 64 but within close proximity to switch assembly 18 along the longitudinal direction of base plate 64.

Innermost surface 122 of plate 62 has removably mounted to it, by means of nuts and screws, the high voltage rectifier assembly 11 distal to bottom surface 124. The rectifier assembly comprises a multiplicity of diodes 96 removably secured to and arranged rectangularly about the edges of a mounting board 17. Also removably mounted, by means of nuts and screws, to innermost surface 122 of vertical plate 62 is a voltage sense network 14 and a current sense network 13 both proximal to bottom surface 124. Both rectifier assembly 11 and networks 14 and 13 respectively, are mounted in close proximity to each other and both current sense network 13 and voltage sense network 14 are mounted on the same printed circuit mounting board 15.

The opening 106 of tank 40 has permanently fixed and welded cover portion 54 and a removably secured cover portion 38. Fixed portion 54 covers a predetermined fraction of tank opening 106 and is permanently welded to a portion of the top three edges of three sides of the tank. A second tank wall 131, which has one entire top edge 134 permanently fastened to the fixed cover portion 54, is welded perpendicularly to a first tank wall 136 on whose interior surface 137 is permanently welded and mounted three lugs 52, 55 and 60. The top lugs 55 and 60 are each positioned an equal distance below cover 54 and along interior surface 137 of tank wall 136. The lugs 55 and 60 are set out from surface 137 by permanently and perpendicularly welding them to a first flat metal shelf 140. Shelf 140 is welded to surface 137 at a predetermined position just below cover 54 in such a way as to be parallel to bottom surface 124 of base plate 64 so to allow lugs 55 and 60 to point perpendicularly toward fixed cover 54. A third bottom lug 52 is similarly welded to a second metal shelf 144. Shelf 144 is permanently welded at the bottom of interior wall 137 in such a way as to be parallel to bottom surface 124 of base plate 64 so to allow lug 52 to point perpendicularly toward fixed cover 54 and positioned so as to lie a predetermined distance below but within the interval that separates the two top lugs 55 and 60. Lugs 55, 52 and 60, when permanently positioned on surface 137, form a triangular, three-point suspension system for subsequently receiving and removably mounting insulated Fibreglass support assembly 98.

Supporting structure or lugs 52, 55 and 60 and shelves 140 and 144 are positioned and permanently secured on interior tank surface 137 depending upon the geometrical configuration and physical dimensions of the component support assembly 98 and the placement of holes 108 and 100 on base plate 64 and sleeve 63 on vertical plate 62.

Lugs 52, 55 and 60 are used for removably securing and suspending support assembly with respect to wall 136 and parallel to wall 131 so as to extend within tank 40. If lugs 52, 55 and 60 are positioned properly, then lug 52 should project through and be received by sleeve 63, lug 55 should project through and be received by hole 100 and lug 60 should project through and be received by hole 108 as component support assembly 98 is placed in its stationary position within the tank.

Lug 55 acts as the ground attachment between the ground bus 30 which, in actuality, is the tank 40, and the grounding plate 29 which is attached to the ground side of the switch 18. This single grounding point at ground bus 30 grounds the entire T/R set 10.

The function of the high voltage step-up transformer 48 is to increase the voltage from the low voltage supply to the high voltage required for the precipitator. The transformer primary is designed to match the type of controller used and to provide the secondary with voltage and current to meet the load requirement. The secondary of the high voltage transformer feeds two quick disconnect couplings of rectifier assembly 11. This high voltage rectifier bridge assembly 11 is connected across the transformer secondary at quick disconnect terminal 12 and quick disconnect terminal 34. The negative polarity DC output from the rectifiers 96 is connected to a high voltage two position switch or, equivalently, a grounding switch 18. The rectifiers are mounted on bolted mounting board 17 that is easily accessible for maintenance purposes. Said mounting board is bolted to molded support by means of bolt and nuts 180. The output of the rectifier bridge is fed to voltage divider network 14 which consists of a plurality of resistors and essentially divides the voltage down to low levels so that sparking, for example, can be detected by the controller. The number of resistors can be varied to accommodate different voltages that may be put into the system. On the same printed circuit board 15 as voltage divider network 14 is a current sense network 13 whose output is at a low potential. The current sense network, with its resistor-to-ground, senses very small currents. The output of the current sense network is also fed to the controller when it is attached. Voltage sense network 14 and current sense network 13 may be used when switch 18 is positioned to ground so that the operator can operate at full voltage capacity for the purpose of determining how much current and voltage is being developed without being directly linked to the precipitator. The negative high voltage input 56 to voltage divider 14 is also provided to high voltage switch assembly 18 via the rigid conductor 16. High voltage, two position switch 18 for full wave T/R is an externally operated grounding switch. In one position the switch is set to ground. In the second or only other alternative position the switch is set to full wave output. The switching occurs by movement of a shaft (not shown) which projects through fixed cover 54 of tank 40 and is connected to the insulated point 80 of the switch assembly. Air core reactor 20 is installed in series, using a quick disconnect coupling, with high voltage DC output bushing 26 via wire 20a, and is also connected to high voltage switch assembly 18 via wire 49. The purpose of air core reactor 20 is to limit high frequency capacitance discharge current surges generated during sparking in the laod. When the high voltage switch in switch assembly 18 is set to ground the high voltage link is now opened from rectifier bridge 11 through to single high voltage bushing 26. While the switch is positioned to ground, the energy from the precipitator can be drawn to ground through air core reactor 20. The grounding terminal of high voltage switch assembly 18 begins with grounding plate 29 which is attached to ground bus 30 through support lug 55, and which forms a common ground point for the entire T/R set 10.

Transformer 48 is independent of the component support assembly 98 and, aside from the quick disconnect couplings between transformer 48 and rectifier bridge 11, is separately installed and apart from the components of the support assembly and other portions of power supply 10.

In the method of manufacture, two fiberglass plates are molded together forming a right angle L-shaped support comprising horizontal base plate 64 and vertical plate 62 formed integrally.

One end portion 102 of base plate 64 extends slightly beyond surface 120 of vertical plate 62 thereby elongating the width of one region of plate 64 and forming rectangular tab 104. The right angle corner of vertical plate 62 below tab 104 is removed and the notch that remains provides sufficient room to allow base plate 64 to receive lug 60 and to fit around flat metal shelf 140 on which lug 60 is welded.

Two holes are drilled in elongated end portion 102 of base plate 64, first hole 108 to receive lug 60 and second hole 100 to receive lug 55. Metal sleeve 63 is permanently molded to the bottom corner of vertical plate 62 below tab 104 of base plate 64 and is designed to receive lug 52.

The support frame has mounted on it high voltage switch assembly 18 and air core reactor 20, both secured to top surface 126 of plate 64, and high voltage rectifier assembly 11 on mounting board 17 and current and voltage sense networks, 13 and 14 respectively, printed circuit board 15. Both boards 15 and 17, are secured to inner surface 122 of plate 62 of the support frame. All components are easily accessible when support assembly 98 is manually removed for purposes of maintenance, repair or replacement.

The entire support assembly 98 can be constructed apart from the actual location of T/R tank 40 and transformer 48 and then brought to the site of tank housing 40 and manually inserted through tank opening 106 and removably secured to interior wall 137. Transformer 48 is left in place during the installation of support assembly 98. The components are assembled at a conventional electronic assembly area located away from the site of T/R tank 40. For example, printed circuit board 15, on which is mounted, in a conventional way, voltage divider 14 and current sense network 13, are completely constructed independently of the molded support, tank housing 40 and transformer 48 and, when completed, simply bolted to the molded support. The completed support assembly 98 is then brought to the site of tank housing 40 and installed independently of transformer 48. Assembly 98 is not physically rigged to transformer 48 but is only electrically connected to it. The cables, copper connectors and wires that link input and output terminals of the assembled components are secured and rigid so as to prevent tension and shear forces acting on them during shipment and, also, to prevent them from making contact with the current carrying elements of other assembled components, thereby preventing electrical damage to the T/R set 10.

Transformer 48 and support assembly 98 may be received into the interior of tank 40 through tank opening 106. First, transformer 48 is received by tank 40 with the aid of a winch and securely bolted into position or otherwise rigidly secured at the bottom of the tank directly under cover portion 38. Second, support assembly 98 can be moved in an arcuate and angular path through opening 106 and displaced toward interior tank wall 137 to one side of transformer 48 where it is received by a triangular, three-point lug support means (lugs 60, 55, 52) where each lug is permanently mounted on metal shelves (140, 144) which are welded to interior wall 137.

Support assembly 98 can be manually moved, inserted and positioned within tank 40 and, when secured to interior wall 137, is compact and accessable for purposes of maintenance and repair and can be quickly and easily removed as a unit if circumstances so require.

The support assembly is secured to interior tank wall 137 directly beneath fixed cover portion 54 such that high voltage grounding switch assembly 18 lies directly below the high voltage switch cover 36 that is mounted on cover 54 and air core reactor 20 is offset to and lies above internal portion of high voltage bushing 26 which is also mounted on fixed cover 54. Air core reactor 20 is connected to bushing 26 by a single quick disconnect coupling again allowing for ease of removal of support assembly 98 when required. The switching occurs by an external shaft which is attached between high voltage switch assembly 18, that is mounted inside the tank, and cover 54 at a point directly under high voltage switch cover 36.

Opening 106 of the tank which is covered by the cover portion 38 is designed around the dimensions of transformer 48 such that the size of the opening is essentially a decrease of the size of the openings in prior tanks.

Once transformer 48 and support assembly 98 are in place within tank 40, the manually removable cover portion 38 can be replaced and secured to the top of the side walls of tank 40. Support assembly 98 is independent from and not attached to either of cover portions 38, 54 in this particular embodiment. Flanges 162 can be bolted to sleeves 160 thereby completely covering and securing opening 106 to prevent leakage so that support assembly 98 and transformer 48 are enclosed entirely by tank 40.

Support assembly 98 and transformer 48 are securely mounted in close proximity to each other within tank 40 but as two distinct and separate elements of T/R set 10. The transformer is only electrically attached to the compact insulated support assembly 98 by two quick disconnect couplings that provide the connection between the secondary of transformer 48 and input terminals 34 and 12 of high voltage rectifier assembly 11.

Support assembly 98 is installed subsequent to the placement and positioning of transformer 48 at the bottom of tank 40. Support assembly 98 is angularly displaced as it is inserted through tank opening 106 and is secured and removably bolted to the triangular three point lug (55, 52 and 60) support means. In its final position, top surface 126 of base plate 64 is parallel to and faces fixed cover portion 54 and outermost surface 120 of plate 62 is parallel to and faces interior tank wall 137. However, even though support assembly 98 is in close proximity to interior tank wall 137, it does not touch any of the interior walls of the tank except at the three points of attachment.

Now that the principles of the invention have been explained, it will be understood that many modifications may be made, for example, support assembly 98 may be removably secured to a single cover of opening 106 of tank 40. It will also be understood that cover 54 may be of a type that is substantially fixed but also removable if desired. In a still further embodiment, a cylindrically shaped tank may be provided having an insulated support assembly 98 suspended from the interior concave wall of the tank. The support assembly may be supported by a similar support structure substantially along the direction of a chord of the curved surface of the tank and does not touch that portion of the curved tank from which the support assembly 98 is suspended and that portion of the tank towards which the suspended support assembly 98 is directed.

What is claimed is:

1. A high voltage DC power supply having a transformer and other electrical components housed within a tank containing fluid having at least one cover and one sidewall with the transformer rigidly secured to the tank comprising
   (a) a compact easily removable support assembly supported independently of said cover and said transformer and carrying at least a major portion of said other electrical components, said support assembly including an "L" shaped insulated support frame, and
   (b) support structure means removably securing and suspending at least one leg of the "L" of said support assembly solely from said side wall so as to extend the support assembly interiorly within said tank independent and free of attachment to other portions of the tank and power supply whereby the support assembly by itself is removable while leaving the transformer and fluid in place in said tank.

2. The high voltage DC power supply of claim 1 in which there is provided a top for said tank formed of a (1) fixed first cover section and (2) a second removably secured cover portion for covering an opening in the tank only substantially large enough to receive said transformer.

3. A high voltage DC power supply as recited in claim 2 in which the support assembly includes a ground plate electrically and mechanically coupled to the support structure means.

4. The high voltage DC power supply of claim 3 in which said support assembly includes rectifying means and means for removably coupling said rectifying means to said transformer.

5. The high voltage DC power supply as recited in claim 2 in which said support structure means includes at least one upper lug and at least one lower lug fixed to a side wall of said tank, and being received in openings in said support assembly.

6. A high voltage DC power supply having a transformer and other electrical components housed within a tank containing fluid having at least one cover and first and second vertical side walls perpendicular to each other with the transformer rigidly secured to the tank comprising
   (a) a support assembly independent of said cover and said transformer carrying at least a major portion of said other electrical components, said support assembly including an "L" shaped insulated support frame, and
   (b) support structure means removably securing and suspending at least one leg of the "L" of said support assembly solely from said first side wall and substantially parallel to said second side wall free of attachment to other portions of the tank and power supply whereby the support assembly by itself is removable while leaving the transformer and fluid in place in said tank.

7. The high voltage DC power supply of claim 6 in which the support structure means is secured to the tank for suspending the support assembly perpendicular to the first wall and to a third wall which is opposite and parallel to said first wall.

8. The high voltage DC power supply of claim 6, in which there is provided a top for said tank formed of a (1) first cover portion and (2) a second removably secured cover portion for covering an opening in the tank only substantially large enough to receive said transformer.

9. The power supply as recited in claims 1 or 6 in which said support frame is formed of two integrally molded plates.

10. The power supply as recited in claims 1 or 6 in which said support structure means includes first mating means fixed to said side wall and second mating means formed on the one upper horizontal leg of the "L", said first and second mating means being received one in the other.

11. The power supply as recited in claim 10 in which said support structure means includes third mating means fixed to said side wall and fourth mating means formed on the other lower vertical leg of the "L", said third and fourth mating means being received one in the other.

12. The power supply as recited in claim 11 in which said first and second mating means together comprise at least one lug and opening combination.

13. The power supply as recited in claim 12 in which said third and fourth mating means together comprise a single lug and opening combination for the lower end of support assembly.

* * * * *